United States Patent
Doshi et al.

(10) Patent No.: US 7,332,264 B2
(45) Date of Patent: *Feb. 19, 2008

(54) PHOTO-DEFINABLE SELF-ASSEMBLED MATERIALS

(75) Inventors: Dhaval Doshi, Los Alamos, NM (US); Hongyou Fan, Albuquerque, NM (US); Nicola Huesing, Vienna (AT); Alan Hurd, Tijeras, NM (US); Charles Jeffrey Brinker, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/373,565

(22) Filed: Feb. 26, 2003

(65) Prior Publication Data

US 2007/0287104 A1    Dec. 13, 2007

Related U.S. Application Data

(60) Continuation-in-part of application No. 10/100,108, filed on Mar. 19, 2002, now Pat. No. 6,808,867, which is a division of application No. 09/543,572, filed on Apr. 5, 2000, now abandoned.

(60) Provisional application No. 60/127,803, filed on Apr. 5, 1999.

(51) Int. Cl.
*G03F 7/26*    (2006.01)

(52) U.S. Cl. ...................................... 430/322
(58) Field of Classification Search ................ 430/320, 430/322
See application file for complete search history.

(56) References Cited

U.S. PATENT DOCUMENTS

| | | | |
|---|---|---|---|
| 5,057,296 A | 10/1991 | Beck | 423/277 |
| 5,098,684 A | 3/1992 | Kresge et al. | 423/718 |
| 5,360,834 A | 11/1994 | Popall et al. | 522/36 |
| 6,808,867 B2 | 10/2004 | Doshi et al. | |

*Primary Examiner*—Kathleen Duda
(74) *Attorney, Agent, or Firm*—Schwegman, Lundberg & Woessner P.A.

(57) ABSTRACT

The present invention provides a mesoporous material comprising at least one region of mesoporous material patterned at a lithographic scale. The present invention also provides a method for forming a patterned mesoporous material comprising: coating a sol on a substrate to form a film, the sol comprising: at least one photoactivator generator, at least one material capable of being sol-gel processed; and exposing the film to light to form a patterned mesoporous material.

66 Claims, 18 Drawing Sheets

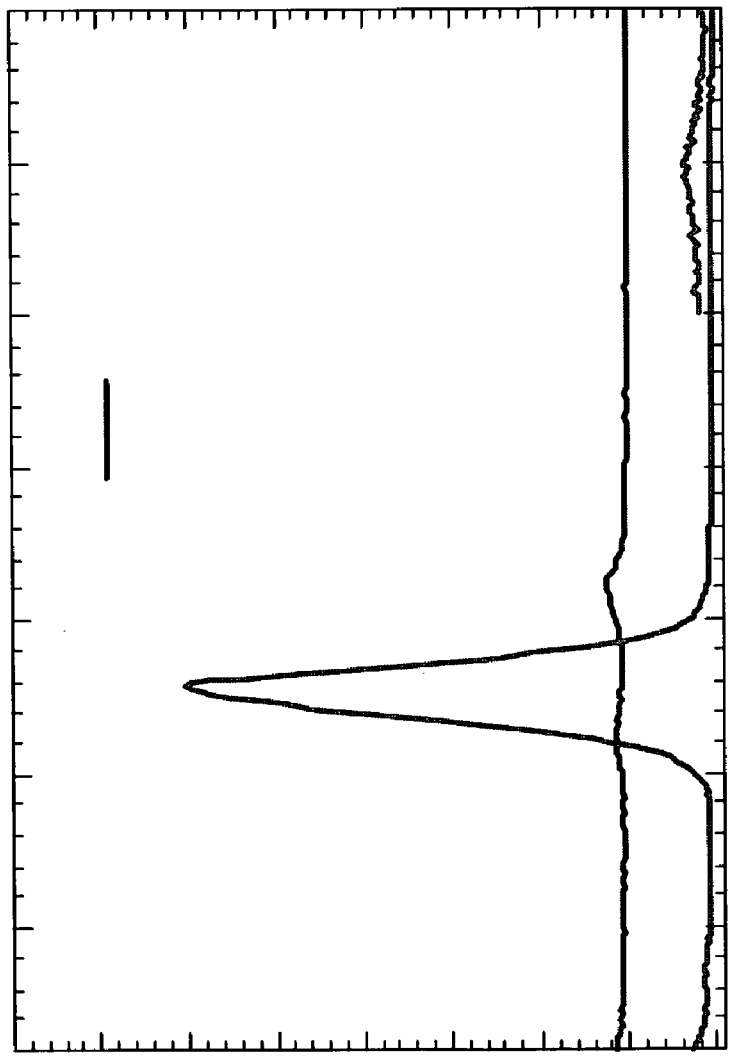
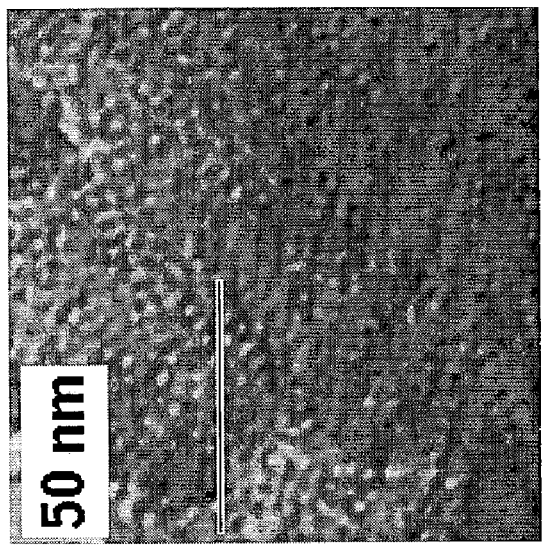
Fig. 2B
HRTEM of NOT Irradiated
Fig. 2A
XRD and TEM results show a phase transformation from a disordered to a 1dH mesophase with UV irradiation for a calcined 4% CTAB film

OPTICAL PROPERTIES

| | | |
|---|---|---|
| Unirradiated | 3651± 26 | 1.454 |
| UV Irradiated | 3602± 21 | 1.457 |
| Unirradiated, Calcined | 2293± 22 | 1.302 |
| UV Irriadiated Calcined | 2399± 23 | 1.277 |

Refractive index and thickness data obtained by spectroscopic ellipsometry, $\eta$ at $\lambda=630$nm

- Refractive index difference can be utilized
- for wave guide applications
- A gradient of refractive index would be
- useful for non-linear optics Photoacids are compounds that generate acids upon irradiation with light. Diaryliodonium compounds release a strong Bronsted acid.

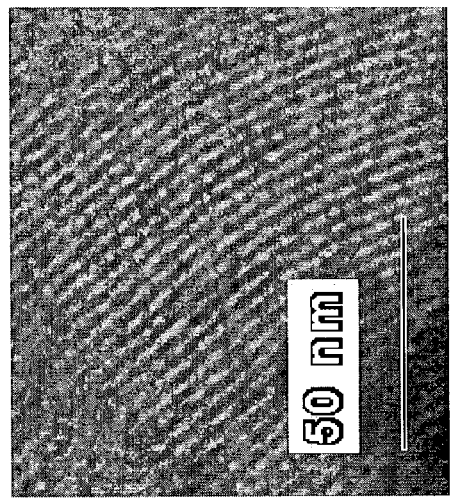
Fig. 6B
| | UNIRR | IRR |
|---|---|---|
| $Q^2$ | 9.61% | 8.22% |
| $Q^3$ | 57.75% | 55.08% |
| $Q^4$ | 32.64% | 36.69% |
| ER | 80.8 % | 82.1% |
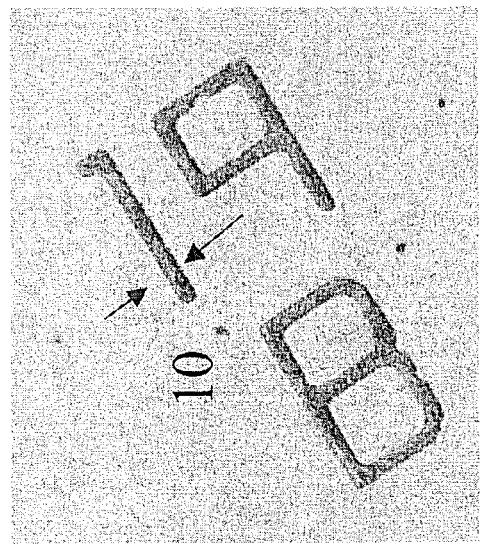
Fig. 6C
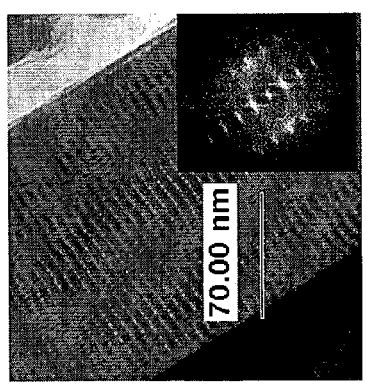
Fig. 5B
Fig. 6A Optically define open and closed porosity in a self-assembled polymer/silica nanocomposite Spin Coat (2000 rpm, 30s) → UV Expose (10 min) → Post Exposure Bake (95 °C, 5 min) → Develop (Propylene Glycol Methyl Ether Acetate)

PHOTO-DEFINABLE SELF-ASSEMBLED MATERIALS

CROSS-REFERENCE TO RELATED APPLICATIONS

This application is a continuation-in-part application of U.S. patent application Ser. No. 10/100,108, entitled "Photo-Definable Self-Assembled Materials," filed Mar. 19, 2002 now U.S. Pat. No. 6,808,867, which is a divisional application of U.S. patent application Ser. No. 09/543,572, entitled "Photo-Definable Self-Assembled Materials," filed Apr. 5, 2000 now abandoned, which claims priority to U.S. Provisional Patent Application No. 60/127,803, entitled "Nanostructural Lithography Tailoring of Mesophases in Thin Silica Films," filed Apr. 5, 1999. The entire disclosures and contents of the above-identified patent applications are hereby incorporated by reference.

GOVERNMENT INTEREST STATEMENT

This invention is made with government support under Grant Number BF-4277 awarded by Sandia National Laboratories. The government may have certain rights in this invention.

BACKGROUND OF THE INVENTION

1. Field of the Invention

The present invention relates to mesoporous structures.

2. Description of the Prior Art

The International Union of Pure and Applied Chemistry, IUPAC, classifies porosity on the basis of pore diameter, $d_p$. Mesoporous materials are defined by IUPAC as those materials in which 2 nm mesoporous inorganic materials comprise inorganic xerogels (e.g., the common silica desiccants), pillared clays, and the subject matter of this application. Mesoporous molecular sieves (MMS), discovered by researchers at Mobil, are described in U.S. Pat. No. 5,098,684, issued to Kresge et al. on Mar. 24, 1992, and U.S. Pat. No. 5,057,296 issued to J. S. Beck on Oct. 15, 1991, the entire contents and disclosures of which are hereby incorporated by reference. These materials are referred to in the literature as the MCM (Mobil composition of matter) family of materials. MMS prepared generally as powders have received enormous attention by the research community since their announcement by Kresge et al. (Kresge C. T., Leonowicz M. E., Roth W. J., Vartuli J. C., Beck J. S., Nature, 1992, 359: 710-712, the entire contents and disclosure of which is hereby incorporated by reference). In the past two years, advances have been made in understanding and exploiting the supramolecular templating process used in MMS formation, development of new synthetic procedures, extending the compositional range beyond silicas, and processing of MMS as thin films. MMS are high surface area amorphous solids (with surface areas up to 1400 $m^2/g$) characterized by monosized cylindrical pores, ranging from about 12-100 Å in diameter, organized into periodic arrays that often mimic the liquid crystalline phases exhibited by surfactants. MMS synthesis procedures typically require four reagents: water, surfactant, a soluble inorganic precursor, and a catalyst. MMS form (as precipitates) in seconds to days (Beck J. S., Vartuli J. C., Roth W. J., Leonowicz M. E. Kresge C. T., Schmitt K. D., Chu C. T. W., Olson D. H., Sheppard E. W., McCullen S. B. et al., J. Am. Chem. Soc., 1992, 114: 10835; Huo Q., Margolese D. L., Ciesla U., Demuth D. G., Feng P., Gier T. E., Sieger P., Firouzi A., Chmelka B. F., Schuth F., Stucky G. D., Chem. Mater., 1994, 6: 1176-1191, the entire contents and disclosures of which are hereby incorporated by reference) at temperatures ranging from 180° C. to as low as −14° C., depending on the inorganic precursor. Before pyrolysis or surfactant extraction, pure silica MMS exhibit three structure types: (1) hexagonal (referred to as H or MCM-41), a 1-d system of hexagonally ordered cylindrical silica channels encasing cylindrical surfactant micellar assemblies; (2) cubic (C), a 3-d, bicontinuous system of silica and surfactant; and (3) lamellar, a 2-d system of silica sheets interleaved by surfactant bilayers.

Over the past several years, various MMS synthetic pathways have been elucidated (Beck J. S., Vartuli J. C., Curr. Opinion in Solid State and Material Science, 1996, 1: 76-87, the entire contents and disclosure of which is hereby incorporated by reference). Experimentally, it has been shown that MCM-41 type phases form under conditions in which the surfactant—before the addition of the silica source—is free (surfactant concentration is less than the critical micelle concentration for spherical micelles). In the past several years, there has been synthesized multicomponent and non-silica MMS (Huo Q., Margolese D. L., Ciesla U., Demuth D. G., Feng P., Gier T. E., Sieger P., Firouzi A., Chmelka B. F., Schuth F., Stucky G. D., Chem. Mater., 1994, 6: 1176-1191, the entire contents and disclosure of which is hereby incorporated by reference) for catalytic applications due to their higher surface areas and greater accessibility of active sites compared to zeolites.

In the past few years, various pathways have been explored to access a wide spectrum of mesostructured materials with tunable pore sizes and arrangements (orientation) and good compositional control. These materials include ionic, covalent and electrostatic interactions, and they permit the addition of salts and auxiliary solvents. A variety of macro- and microstructures have been synthesized such as powders, fibers, monoliths, thin films, hollow and transparent hard spheres, and aerosol particles, which find applications in catalysis, membrane separation, sensors, optoelectronics and as novel nanomaterials, see Jackie Y. Ying, C. P. Mehnert, M. S. Wong, Angew. Chem. Int. Ed., 1999, 38, 56-77; C. J. Brinker, Curr. Opin. Solid State Mater. Sci., 1, 798-805, 1996; J. C. Vartuli, C. T. Kresge, W. J. Roth, S. B. McCullen, J. S. Beck, K. D. Schmitt, M. E. Leonowitz, J. D. Lutner, E. W. Sheppard, Advanced Catalysts and Nanostructured Materials: Modern Synthesis Methods (Ed: W. R. Moser) Academic Press, New York, 1-19(1996); G. D. Stucky, Q. Huo, A. Firouzi, B. F. Chmelka, S. Schacht, I. G. Voigt Martin, F. Schuth, Progress in Zeolite and Microporous Materials, Studies in Surface Science and Catalysis, 105, (Eds: H. Chon, S. K. Ihm, Y. S. Uh), Elsevier, Amsterdam, 3-28, (1997); N. K. Raman, M. T. Anderson, C. J. Brinker Chem. Mater., 8, 1682-1701, 1996; D. M. Antonelli, J. Y. Ying, Curr. Opin. Coll. Interf. Sci., 1, 523-529, 1996; D. Zhao, P. Yang, Q. Huo, B. F. Chmelka and G. D. Stucky, Current Opinion in Solid State & Materials Science, 3,111-121, 1998; Y. Lu, H. Fan, A. Stump, T. L. Ward, T. Rieker, C. J. Brinker, Nature, 398, 223-226, 1999, the entire contents and disclosures of which are hereby incorporated by reference. However, none of these processes provide an ability to design these materials with a controlled combination of mesophases or the ability to pattern functionality.

SUMMARY OF THE INVENTION

It is therefore an object of the present invention to provide a lithographic process that allows control of structure and properties (refractive index, thickness, porosity, pore orientation) and functionality of meso-ordered films, powders and bulk systems.

It is another object of the present invention to provide a lithographic process that uses the presence of a photoactive, photosensitive or photoresponsive species to affect the mesophase of meso-ordered films, powders and bulk systems.

According to a first broad aspect of the present invention, there is provided a method for forming a patterned mesoporous material comprising: coating a sol on a substrate to form a film, the sol comprising: at least one photoactivator generator and at least one material capable of being sol-gel processed; and exposing the film to light to form a patterned mesoporous material.

According to a second broad aspect of the invention, there is provided a method for forming a patterned mesoporous material comprising: coating a sol on a substrate to form a film, the sol comprising: at least one photopolymerizable compound and at least one material capable of being sol-gel processed; and exposing the film to light to polymerize the at least one photopolymerizable compound and to form a patterned mesoporous material.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 2A illustrates an X-Ray diffraction pattern for a UV irradiated and unirradiated film after calcination for a 4% CTAB mesoporous film according to an embodiment of the present invention;

FIG. 2B is an HR-TEM of a mesoporous film that has not been irradiated corresponding to the pattern in 2A;

FIG. 5B is a cross-section HR-TEM image of the 3% Brij 56 film made with 1N acid;

FIG. 6A is an optical image of an etched/calcined film according to an embodiment of the present invention;

FIG. 6B is a list of $^{29}Si$-NMR results of uncalcined powders made from drying Brij-56/PAG sols in a petri dish for UV irradiated and unirradiated films;

FIG. 6C is an HR-TEM image of an etched/calcined Brij-56 film according to an embodiment of the present invention;

DETAILED DESCRIPTION OF THE PREFERRED EMBODIMENT

Figure 1:
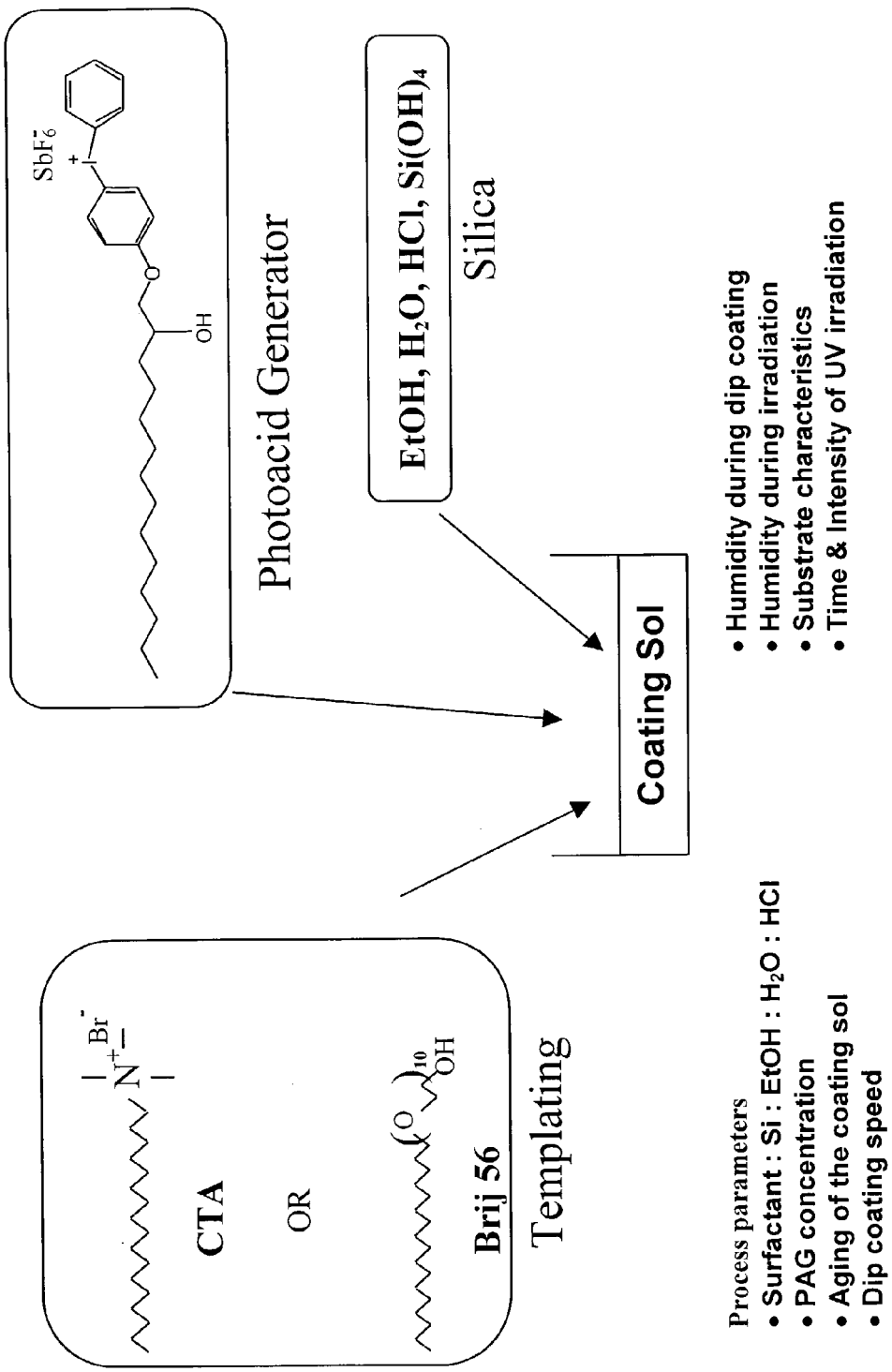
FIG. 1 illustrates, in schematic form, the chemistry and process parameters for forming a coating sol used in a method according to an embodiment of the present invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "lithographic technique" refers to any process, including conventional lithographic processes such as using masks with UV light exposure or other forms of light or electromagnetic exposure, followed optionally by etching by an acid, base, etc. or optionally by heating/calcination that may be used to form a pattern in silica.

For the purposes of the present invention, the term "pattern" refers to any silica structure having a shape or property that may be defined using lithographic techniques, whether or not the pattern is actually formed using a lithographic technique or another type of technique.

For the purposes of the present invention, the term "patterned at a lithographic scale" refers to a pattern having the size of any pattern that may be formed in silica using a lithographic technique. A pattern of the present invention has a lithographic scale whether the pattern is formed using a lithographic technique or another type of technique.

For the purposes of the present invention, the term "unpatterned" refers to any material that is not patterned at a lithographic scale.

For the purposes of the present invention, the term "capable of being sol-gel processed" includes any compound that may be used in sol-gel processing techniques such as those described in U.S. Pat. No. 5,360,834, the entire disclosure and contents of which is hereby incorporated by reference. Hydrolytic polycondensation by a sol-gel process is a process that is known for production of amorphous inorganic networks that may be converted into glasses, ceramics and inorganic-organic hybrid materials, see, for example, H. Schmidt, J. Non-Crystall. Solids, 100 (1988), page 51, C. J. Brinker, page 31 and J. Fricke, page 169. Monomeric or precondensed hydrolyzable and condensable compounds having an inorganic central atom are hydrolyzed and precondensed by adding water and, if appropriate, catalyst, until a sol forms; condensation to a gel is then carried out in bulk or during film coating, usually by adding a pH-active catalyst. The gel may be converted into the above-mentioned materials by treatment with heat and/or radiation. Compounds capable of being used in sol-gel processing include not only silica, but, generally, organometal alkoxides and compounds of silicon (Si), aluminum (Al), boron (B), lead (Pb), tin (Sn), titanium (Ti), zinc (Zn), zirconium (Zr), cerium (Ce), lanthanum (La), yttrium (Y), neodymium (Nd), etc.

For the purposes of the present invention, the term "photoactivator generator" refers to any compound that forms or decomposes to a photoactivator in the presence of light, such as UV light. Examples of photoactivator generators are photosensitive, photoresponsive, or photoactive compounds such as, photoacids, photobases, photoinitiators (whether neutral or not), photocleavable compounds (including polymers), photolabile compounds, photodecomposable compounds, photopolymerizable compounds (for example, photoresist SU8), photoamphiphiles, etc. In the methods of the present invention, such compounds may be found individually or in multiples of a particular type, or combinations of different types of compounds.

For the purposes of the present invention, the term "photoactivator" refers to any compound formed by interaction of light with a photoactivator generator.

For the purposes of the present invention, the term "photoacid" refers to an acid generated by photolysis of a photoacid generator.

For the purposes of the present invention, the term "photobase" refers to a base generated by photolysis of a photobase generator.

For the purposes of the present invention, the term "photoinitiator" refers to a compound that is capable of initiating a reaction.

For the purposes of the present invention, the term "photocleavable compound" refers to a compound that may be molecularly cleaved by light.

For the purposes of the present invention, the term "photolabile compound" refers to a compound that has groups that detach/separate from a parent molecule when exposed to light.

For the purposes of the present invention, the term "photodecomposable" refers to a compound that decomposes into smaller compounds, which may be gaseous, when exposed to light.

For the purposes of the present invention, the term "photopolymerizable compound" refers to a compound that undergoes polymerization when exposed to light.

For the purposes of the present invention, the term "photoamphiphile" refers to an amphiphile that changes properties due to light exposure.

For the purpose of the present invention, the term "solvent" refers to any aprotic or protic solvent such as methanol, ethanol, tetrahydrofuran, etc.

For the purposes of the present invention, the term "hybrid material" refers to any material that is composed of both organic and inorganic materials.

For the purposes of the present invention, the term "wetting behavior" refers to the behavior of a compound (typically a solution) deposited on a surface and which is usually quantified by a wetting angle.

For the purposes of the present invention, the term "etching behavior" refers to the ability of a material to be etched, dissolved, or removed from its original state.

For the purposes of the present invention, the term "mesostructured" refers to a material that has structures/features on the 1 to 50 nanometer length scale. Mesoporous materials are a subset of mesostructured materials that are porous on this scale.

For the purposes of the present invention, the term "selectively depositing" refers to a deposition process in which the extent to which a material is deposited is dependent upon a particular characteristic of the substrate material, such as the wetting behavior of the substrate material. Thus, a substrate material with regions having different wetting behavior properties may have varying degrees of material deposition that correspond to such wetting behavior properties.

For the purposes of the present invention, the term "discrete" refers to the difference between at least two regions of a material having different physical properties in which the difference is one of kind. For example, one region may be photosensitive, while another region is not photosensitive.

For the purposes of the present invention, the term "gradient" refers to the difference between at least two regions of a material having different physical properties in which the difference is one of amount. For example, one region may have a refractive index of 1.454, while another region has a refractive index of 1.457. More than two regions may be viewed to establish a "continuous gradient" if the regions differ in amount substantially continuously along the regions. In other words, three regions may be described as having a "continuous gradient" if a first region has a refractive index of 1.454, a second contiguous region has a refractive index of 1.457, and a third region contiguous to the second region has a refractive index of 1.459.

Description

Control of structure on multiple length scales is evident and crucial to advances in micro- and nanotechnologies. To date, thin film silica mesophases have been prepared by nucleation and growth at solid-liquid and liquid-vapor interfaces, spin-coating, and dip-coating, these procedures having been additionally combined with soft lithographic techniques (such as, microcontact printing (μCP) and micromolding in capillaries (MMIC)) to create patterned films. However, patterns so formed require long processing times and have been limited to the spatially-defined presence or absence of film. For sensor arrays and micro-fluidic devices, it is also of interest to pattern a thin film mesostructure (for example, hexagonal versus cubic or disordered), thereby spatially controlling properties like refractive index, pore volume, pore size, dielectric constant and accessibility of the thin film mesoporosity to the vapor or liquid phase. The present invention in part provides a lithographic procedure that enables selective etching of silica mesophases (thereby serving as a 1-step negative resist process) and allows patterning of thin film mesostructure, refractive index, wetting behavior, etc.

An exemplary method of the present invention provides an optical lithographic process. A layer, preferably uniform, of photosensitive mesostructured material may be laid down or deposited. The material may be patterned using light by using an optical mask, a laser, etc. The resultant material may have different properties depending on how and where the material is patterned. The material may, in particular embodiments of the present invention, be etched to eliminate selected regions of the material. Etching may be done with or without a photoresist mask. Because the material comprises regions having different properties, the desired regions may be differentially etched based on the different properties. The material that is not etched may have photosensitive properties and may be referred to as a mesostructured or mesoporous material.

A patterning process according to an embodiment of the present invention exploits the pH-sensitivity of both the (silica-) surfactant self-assembly process and the siloxane condensation rate to enable lithographic definition of film presence or absence, as well as spatial control of a thin film mesostructure. For example, in a particular embodiment of the present invention, one may begin with a homogeneous solution of soluble silica, surfactant, photoactivator generator, such as a photoacid, for example, diaryliodonium salt, and HCl with an initial acid concentration designed to minimize the siloxane condensation rate. Preferential ethanol evaporation during dip-coating may be used to concentrate the depositing solution in water, silica, surfactant, HCl, and photoacid, thereby promoting self-assembly into a photosensitive, silica/surfactant, thin film mesophase. Selective exposure of the photosensitive film to ultraviolet light, using, for example, a photo-mask, creates patterned regions of differing acidity. This pH difference affords spatial control of refractive index, thickness, wetting behavior and the mesostructure in the mesoscopic thin films. Methods of the present invention additionally provide for the use of general acid-base chemistry to form structures having such desired features. Acid-base chemistry refers to the entire set of reactions in organic and inorganic chemistry that use acids or bases as reactants or catalysts. In the methods of the present invention, the sol-gel condensation reaction is acid catalyzed and its extent is influenced by the amount of photoacid generated. The ability of a base (such as a NaOH solution) to dissolve silica may be used to selectively etch the films.

An increasing acid-concentration promotes siloxane condensation, so that selective UV exposure results in patterned regions of more highly and more weakly condensed silica. Differential siloxane condensation results in turn in differential solubility, allowing selective etching of weakly condensed regions in aqueous basic media, such as 0.2 M NaOH.

Cooperative self-assembly processes of inorganic species and amphiphilic molecules have experienced major advances. The ability to design these materials with spatially controlled combinations of different mesophases or compositions, and therefore different properties, greatly enhances their utility as nanofunctional surfaces, films and coatings. The general methods of the present invention provide for the formation of such functionalized materials with various desired properties.

Particular embodiments of the present invention provide a simple lithographic procedure that provides deliberate control of structure and properties of a meso-ordered silica film through optical mediation. This nanostructural lithography process exploits the pH sensitivity of supra-molecular self-assembly which provides spatial control over mesophases in the thin film and provides a selective etching capability. Through the addition of a photoactivator generator, such as a photoacid or photobase, in the coating sol along with surfactant and silica source, dip coating results in continuous, ordered photosensitive films. Exposure to UV light through a mask produces local pH changes, which may induce mesostructural phase transitions and an increase in the acid-catalyzed siloxane condensation rate in the exposed regions. Two surfactant systems, CTAB ($CH_3(CH_2)_{15}N^+(CH_3)_3Br^-$) and Brij 56 ($CH_3(CH_2)_{15}(OCH_2CH_2)_{10}OH$) have been studied. X-ray diffraction, transmission and scanning electron microscopy, optical microscopy, ellipsometry, MAS-NMR and atomic force microscopy may be used to characterize the patterned nanostructured materials as thin films or as powders.

Various strategies to pattern mesoporous films have been explored, most of these relying on the use of self-assembled monolayers (SAM), see A. Kumar, N. L. Abott, E. Kim, H. A. Biebuyck, G. M. Whitesides, Acc. Chem. Res., 28, 219-226, 1995, the entire contents and disclosure of which is hereby incorporated by reference. Popall et al., see M. Popall, J. Schulz and H. Schmidt, U.S. Pat. No. 5,360,834 (Nov. 1, 1994), the entire contents and disclosure of which is hereby incorporated by reference, have shown that the formation of the inorganic network by sol-gel processing may be influenced photochemically. Furthermore, the sensitivity of the surfactant lyotropic phases to temperature and pH is well known, see M. J. Rosen, Surfactants and Interfacial Phenomena, Wiley-Interscience, New York, (1989), the entire contents and disclosure of which is hereby incorporated by reference. Particular embodiments of the present invention provide a process that exploits the pH sensitivity of supra-molecular self-assembly by adding a photoactivator generator, such as a photoacid or photobase, in the coating sol to carry out optically induced nanostructural lithography. Stated generally, particular embodiments of the present invention provide a lithographic process that uses a photoactivator generator to affect the sol-gel network of meso-ordered films, powders and bulk systems. The lithographic processes of the present invention provide for better resolution of pattern transfer by using selective etching techniques.

Two exemplary surfactant systems that represent different types of interactions have been closely investigated: for ionic interactions, CTAB was chosen, whereas electrostatic and hydrogen-bonding interactions were explored using a non-ionic block co-polymer Brij 56.

A particular method of forming a coating sol according to an embodiment of the present invention, as shown in FIG. 1, starts with a homogenous solution composed of a soluble silicate species, a photoactivator generator, and surfactant in an ethanol/water solvent with an initial surfactant concentration $c_o$ below the critical micelle concentration $c_{cmc}$. The method according to an embodiment of the present invention employs solvent evaporation-based self-assembly of the surfactant as described previously, see Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364-368, 1997, the entire contents and disclosure of which is hereby incorporated by reference. The co was adjusted in a way that liquid crystal-like structures in the silica/surfactant/solvent/$H^+$ phase diagram close to a phase boundary are accessible. The choice of a suitable photoactivator generator is based on a variety of factors. A photoacid, for example, a diaryliodonium compound, is useful based on its wide application in cationic polymerization, its efficiency in generation of acid upon photolysis, and a well understood photochemistry, see J. V. Crivello, J. H. W. Lam, J. Polym. Sci., Polym. Symp., 1976, 56, 383; J. V. Crivello, J. H. W. Lam, Macromolecules, 1977, 10, 1307; J. L. Dektar, N. P. Hacker, J. Org. Chem., 1990, 55, 639, the entire contents and disclosures of which are hereby incorporated by reference. Due to a chemical modification with a long hydrocarbon chain, the photoacid may be partly solubilized in the surfactant micelle during solvent evaporation and therefore may act as a co-surfactant. This affects the effective packing parameter of the surfactant and hence the structure of the mesophase, see J. Israelachvili, Intermolecular and surface forces, Academic Press, San Diego, (1992), the entire contents and disclosure of which is hereby incorporated by reference. Photochemically induced acid generation in the film causes conditions conducive to structural changes in the pH sensitive silica-surfactant mesophase and also an enhancement in the siloxane condensation rate.

Although the process illustrated in FIG. 1 employs a specific material capable of being sol-gel processed, Si, such as silicic acid and polysilicic acids, and other such materials may also be used in a method according to an embodiment of the present invention. Although the process illustrated in FIG. 1 employs either of two templating molecules, CTAB or Brij 56, other suitable templating molecules may be used in the methods of the present invention. Although HCl is employed as a pH-adjusting acid in the process illustrated in FIG. 1, other suitable acids may be employed in the methods of the present invention. Although a specific photoacid is employed as in the process illustrated in FIG. 1, other suitable photoactid may be employed in the methods of the present invention. Also, although only the use of a particular photoactivator generator (a photoacid) is shown in FIG. 1, the methods of the present invention also encompass the use of any suitable photoactivator generators, such as photobases, photopolymerizable compounds, etc.

As indicated by FIG. 1, the methods of the present invention may use various concentrations of a photoactivator generator, may age the coating sol for various lengths of time, may use various coating speeds, may employ various levels of humidity during coating of the film on a substrate, may using various levels of humidity during the irradiation step, may be employed on various substrates, may employ various times and intensities of irradiation and may employ various times and temperatures for heat treatment and various heat treatment techniques. Also, various coating methods may be employed such as dip-coating, spin coating, spray coating, aerosol coating, etc.

As shown in FIG. 2A, UV irradiation causes a calcined 4% CTAB mesoporous film according to an embodiment of the present invention to undergo a phase change. FIG. 2B shows the same film, except that the film in FIG. 2B has not been UV irradiated, and, therefore, is unpatterned.

Figures 3A, 3B:
FIG. 3A is a list of optical properties for various mesoporous films.
FIG. 3B is an optical image of a patterned mesoporous film of the present invention.

As may be seen in the listing of optical properties in FIG. 3A, there is a significant difference in optical properties between the UV irradiated and unirradiated portions of a given mesoporous film according to an embodiment of the present invention. FIG. 3B shows an optical image of a pattern that may be formed by UV irradiating a film according to an embodiment of the present invention.

Figure 4B:
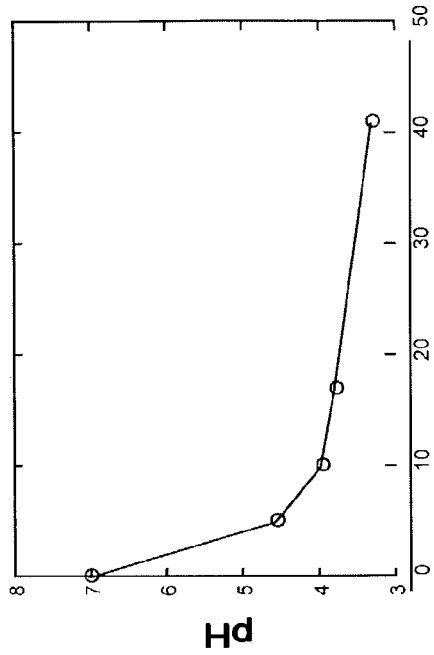
FIG. 4B illustrates a change in pH for the photoacid of FIG. 4A due to the exposure of the photoacid to UV light.
Figure 4C:
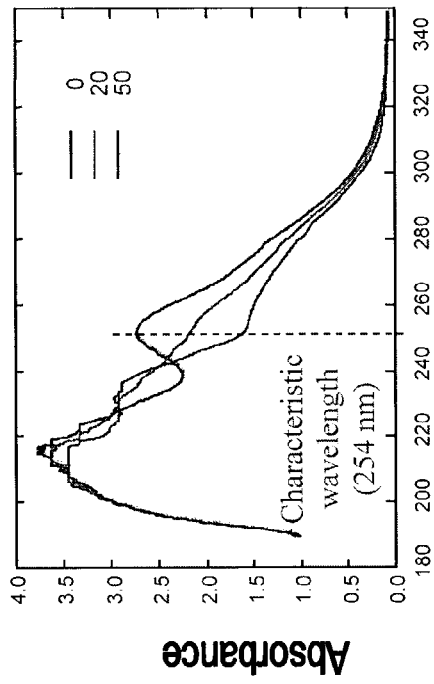
FIG. 4C illustrates a change in absorbance, taken at a characteristic wavelength of 254 nm, for the photoacid of FIG. 4A due to the exposure of the photoacid to UV light.
Figure 4A:
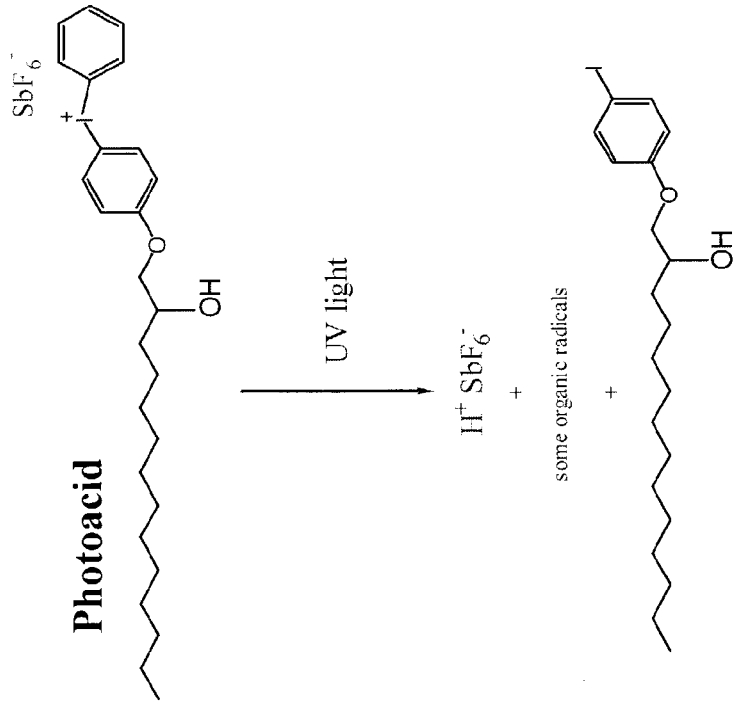
FIG. 4A illustrates the reaction of UV light with a photoacid useful in making a mesoporous film according to an embodiment of the present invention.

FIG. 4A illustrates reaction of UV light with the diaryliodonium photoacid used in the process illustrated in FIG. 1. As may be seen in FIG. 4B, exposure of the photoacid to light decomposes and activates the photoacid, as shown in FIG. 4A, and thereby reduces the pH of a solution or environment containing the acid. FIG. 4C illustrates how the absorbance at a characteristic wavelength of the photoacid is reduced as the photoacid is exposed to UV light and the photoacid decomposes and is activated as illustrated in FIG. 4A.

Figure 5A:
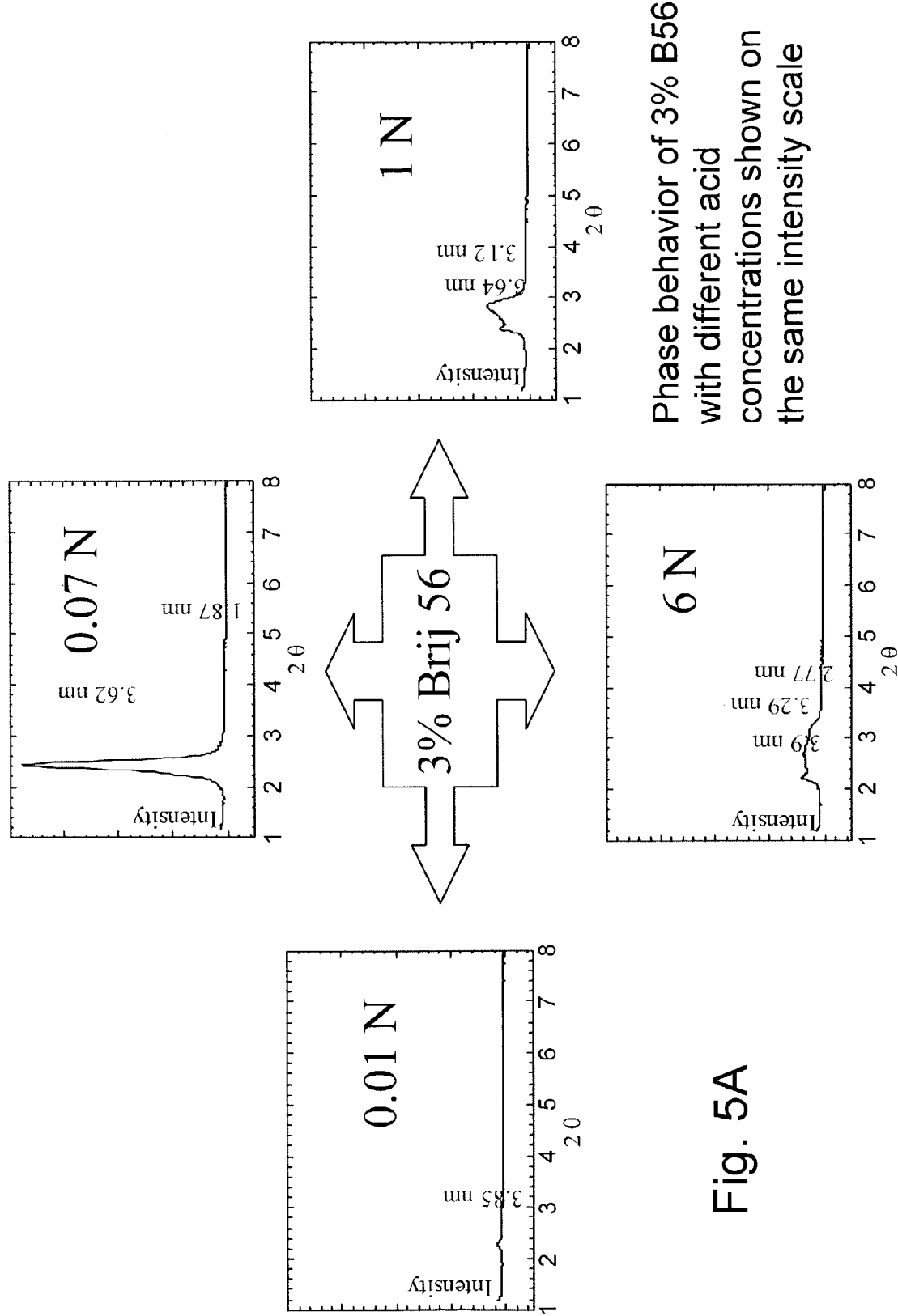
FIG. 5A illustrates phase behavior of mesoporous silica systems of 3% Brij 56 with different HCl acid concentrations shown on the same intensity scale.

FIG. 5A illustrates XRD plots for films prepared using 3% Brij 56 with different HCl acid concentrations shown on the same intensity scale. As may be seen, the phase behavior of Brij 56 is significantly affected by the amount of HCl in a coating solution according to an embodiment of the present invention. FIG. 5B is a cross-section HR-TEM image of the 3% Brij 56 film made with 1N acid.

FIG. 6A is an optical image of an etched/calcined film according to an embodiment of the present invention illustrating the effectiveness of the methods of the present invention in creating patterns in silica. FIG. 6B is a listing of $^{29}Si$-NMR results of uncalcined powders made from drying Brij-56/PAG sols in a petri dish for the UV irradiated and unirradiated films. FIG. 6C is an HR-TEM image of an etched/calcined Brij-56 film according to an embodiment of the present invention that illustrates the ability to build hierarchical structures.

Figure 7B:
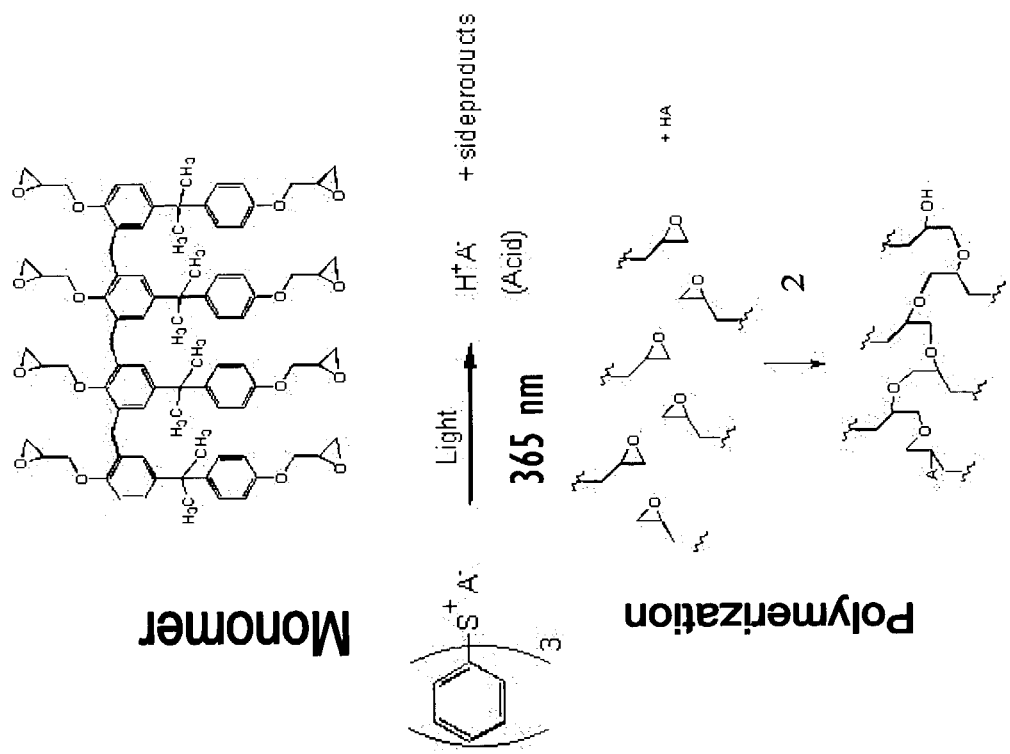
FIG. 7B illustrates polymerization of an epoxide monomer.
Figure 7A:
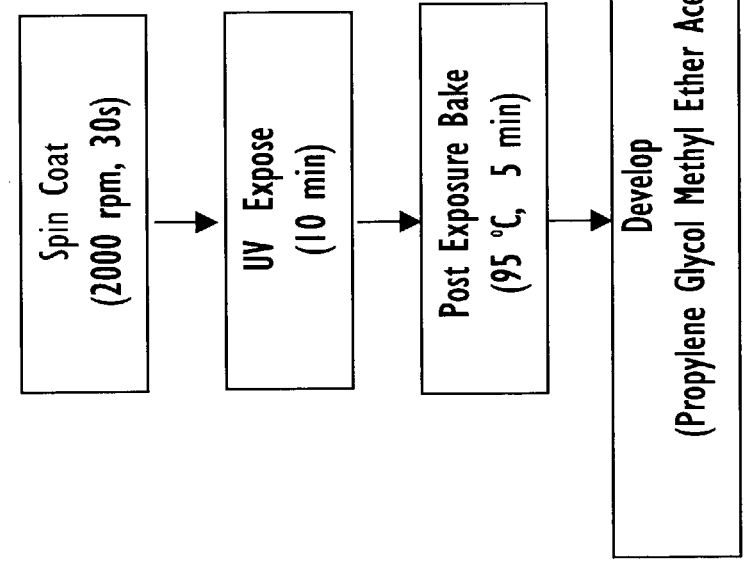
FIG. 7A is a flow chart illustrating a process for optically defining open and closed porosity in a self-assembled polymer/silica nanocomposite according to an embodiment of the present invention.

FIG. 7A is a flow chart illustrating how a self-assembled polymer/silica nanocomposite according to an embodiment of the present invention may be formed. By including an epoxide monomer, a polymer that polymerizes in the presence of light, as illustrated in FIG. 7B, after the mesoporous material has been patterned with UV light and baked, the polymer present in the mesoporous material may be polymerized using 365 nm light. Photolysis may be used to carry out polymerization along with various mesophase changes to produce various materials, including hybrid materials.

Although only the polymerization of one specific organic molecule is shown in FIG. 7A, other organic molecules that are optically polymerizable may be polymerized in a similar fashion. In addition, polymers that are UV polymerizable may also be polymerized during the patterning of the mesoporous material with UV light. In addition, monomeric units with various initiator as separate compounds, or jointly in a single compound, with at least one portion thereof being responsive to light, may be used in the methods of the present invention. Various combinations of such monomers and compounds are also contemplated.

By utilizing a polymerizable monomer in the methods of the present invention, the resultant material may be formed with open and closed pores. The closed pores may be formed to stay closed even after calcination. This process provides for the formation of selective channels or other fluid flow areas. In particular embodiments of the present invention, open and closed pores may be optically defined using a photocleavable, photolabile or photodecomposable compound, for example a particular polymer, along with a photoresist.

Surfactant micelles define the pores and monomer is contained in the micelle core. Photo-polymerization of the monomer makes it insoluble in the developing solvent, hence, when the patterned film is subject to solvent, the surfactant along with unpolymerized monomer are washed away, leaving behind open pores in regions that were not polymerized. The closed pores refer to regions that have the polymer filling the pores (holes) in the silica matrix. Calcination here means an elevated temperature treatment typically between 95-120° C., to remove the developing solvent and further strengthen the silica framework.

Figure 8B:
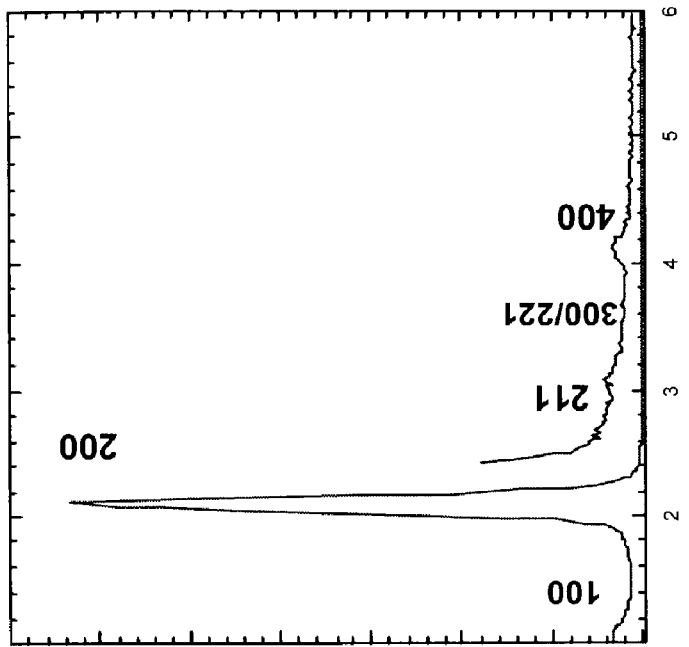
FIG. 8B illustrates an XRD pattern for a Brij 56/SU8 composite film coated on a substrate that is not exposed to UV light and subjected to solvent (PGMEA) development.
Figure 8A:
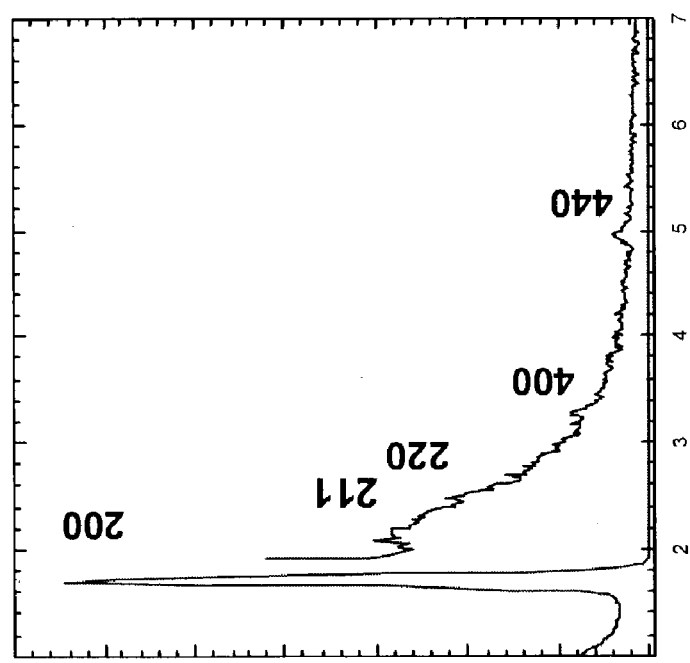
FIG. 8A illustrates an XRD pattern for a Brij 56/SU8 composition as coated on a substrate in which SU8 is an epoxide based negative photoresist.

FIG. 8A illustrates an XRD pattern for a Brij 56/SU8 composition as coated on a substrate. FIG. 8B illustrates an XRD pattern for a Brij 56/SU8 composite film coated on a substrate that is not exposed to UV light and subjected to solvent (PGMEA) development.

Figure 9:
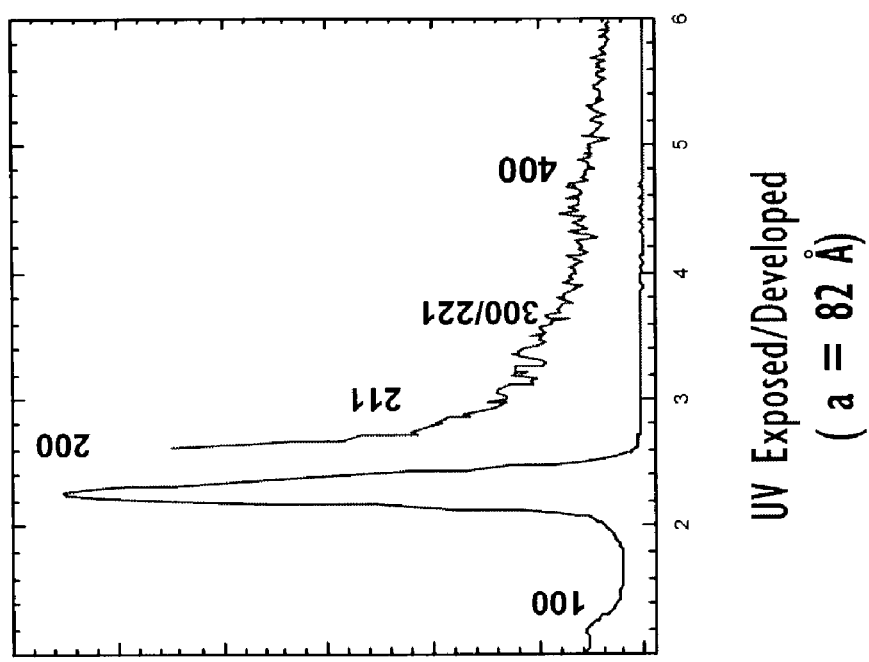
FIG. 9 illustrates an XRD pattern for a Brij 56/SU8 composite mesoporous film according to an embodiment of the present invention after being exposed and patterned by UV light and subjected to solvent development.

FIG. 9 illustrates an XRD pattern for a Brij 56/SU8 composite mesoporous film according to an embodiment of the present invention after being exposed and patterned by UV light and subjected to solvent development.

Particular embodiments of the present invention provide, for the first time, spatial control over the combination of different mesophases in a mesoporous material. This ability to tailor the phase (pore orientation) on a macro/micro scale and other spatially controlled function/property patterning on several length scales in these photo-responsive materials may have far-reaching influence on their applications in sensor arrays, optoelectronics, nano-reactors, photonic and fluidic devices, low dielectric constant films, waveguides, diffractive elements, photonic systems, micro-arrays, and catalysts for micro-reactors.

EXAMPLE 1

Precursor solutions were prepared by addition of a surfactant and a photoacid (a diaryliodonium hexafluoroantimonate compound) to polymeric silica sols made by a two-step procedure (A2**), see C. J. Brinker, R. Sehgal, R. Raman, P. Schunk, T. Headley, J. Sol-Gel Sci. & Tech., 2, 469-476, 1994; designed to minimize the siloxane condensation rate, see C. J. Brinker, R. Sehgal, R. Raman, P. Schunk, T. Headley, J. Sol-Gel Sci. & Tech., 2, 469-476, 1994; and promoting facile silica-surfactant supra-molecular self-assembly during film deposition, the entire contents and disclosures of the above documents are hereby incorporated by reference. First, TEOS ($Si(OC_2H_5)_4$), ethanol, water and HCl (mole ratios $1:4:1:5\times10^{-5}$) were heated at 60° C. for 90 min. This sol was diluted with ethanol (1 sol: 2 $C_2H_5OH$) followed by addition of water and HCl. Finally, surfactant and the photoacid were added such that the final reactant mole ratios were 1 TEOS: 20 $C_2H_5OH$:3.1$H_2O$:0.0065 HCl:0.0956 Brij 56:0.0156 photoacid.

Figure 10:
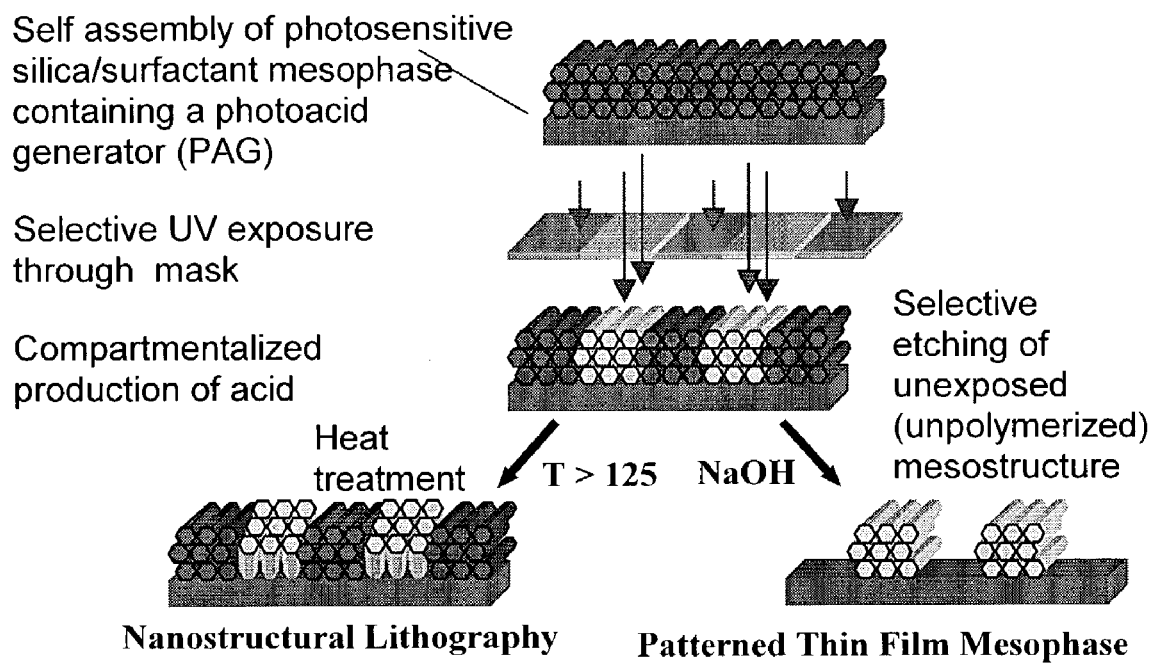
FIG. 10 illustrates a process according to an embodiment of the present invention.

Films were deposited on (100)-silicon by dip-coating at 25.4 cm/min. Following film deposition, the samples were irradiated with short-wave ultraviolet (UV) light for 2 hours through a mask via proximity printing to effectively transfer the pattern onto the silica thin film. Etching of the films was carried out with a 0.2 M NaOH solution. These films were then calcined at 450° C. for 3 hours at a ramp rate of 1° C./min to burn out the organics, drive the structural transformation and form a true mesoporous film, see FIG. 10.

Preferential ethanol evaporation during dip-coating concentrated the depositing solution in water, silica, surfactant, HCl, and photoacid, thereby promoting self-assembly into a photosensitive, silica/surfactant, thin film mesophase. Selective exposure of the photosensitive film to ultraviolet light, using a photo-mask, created patterned regions of differing acidity.

FIG. 11 is an optical image of localized acid generation via co-incorporation of a pH-sensitive dye (ethyl violet). The darkened areas observed for unexposed film correspond to pH>2.5 and the remaining areas observed for UV exposed film correspond to pH 0.

Figure 11A:
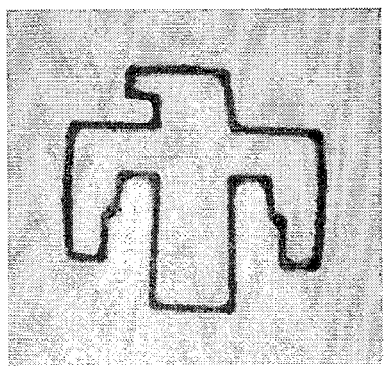
FIG. 11A illustrates an optical image of localized acid generation via co-incorporation of a pH-sensitive dye (ethyl violet) in which the darkened areas/lines observed for unexposed film correspond to pH>2.5 and the remaining areas observed for UV exposed film correspond to pH 0.
Figure 11B:
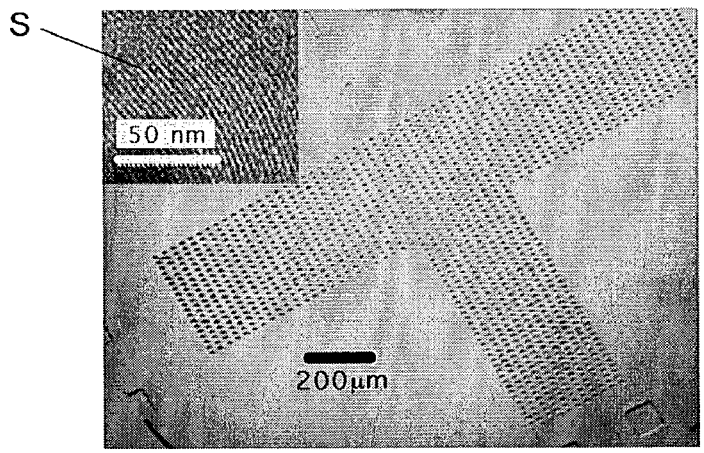
FIG. 11B shows an optical micrograph of a UV-exposed and etched thin film mesophase.

The increasing acid-concentration promoted siloxane condensation, so that selective UV exposure resulted in patterned regions of more highly and more weakly condensed silica. Differential siloxane condensation resulted in turn in differential solubility, allowing selective etching of weakly condensed regions in aqueous basic media (0.2 M NaOH). FIG. 11B shows an optical micrograph of a UV-exposed and etched thin film mesophase. A lithographically-defined (negative) pattern may be observed in which film is present in the exposed regions and absent in the unexposed regions. The plan-view TEM micrograph, see inset S of FIG. 11B, reveals a striped mesoscopic structure consistent with a 1-dimensional hexagonal (1-dH) mesophase.

Figure 11C:
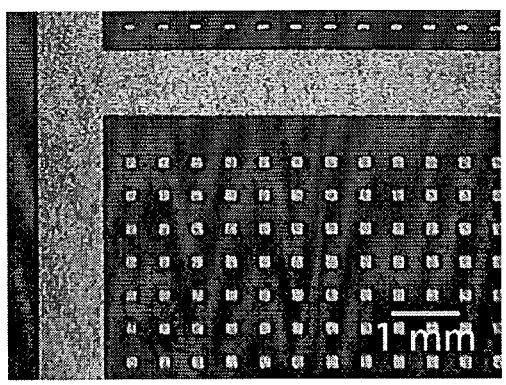
FIG. 11C is an optical interference image of the etched thin film mesophase of FIG. 11B.

Another consequence of differential siloxane condensation is the optical interference image, see FIG. 11C, observed as a result of the thickness and refractive index contrast. A refractive index difference of 0.025 at 630 nm makes it attractive for wave-guide applications.

Figure 11D:
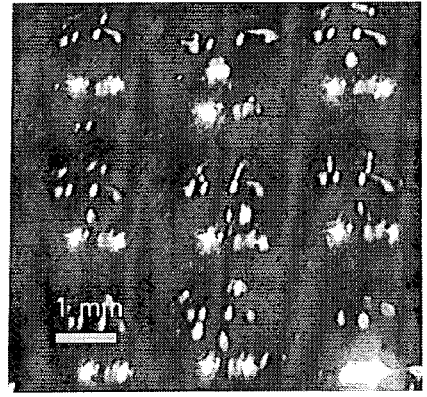
FIG. 11D shows an array of water droplets contained within patterned hydrophobic/hydrophilic corrals.
Figure 12:
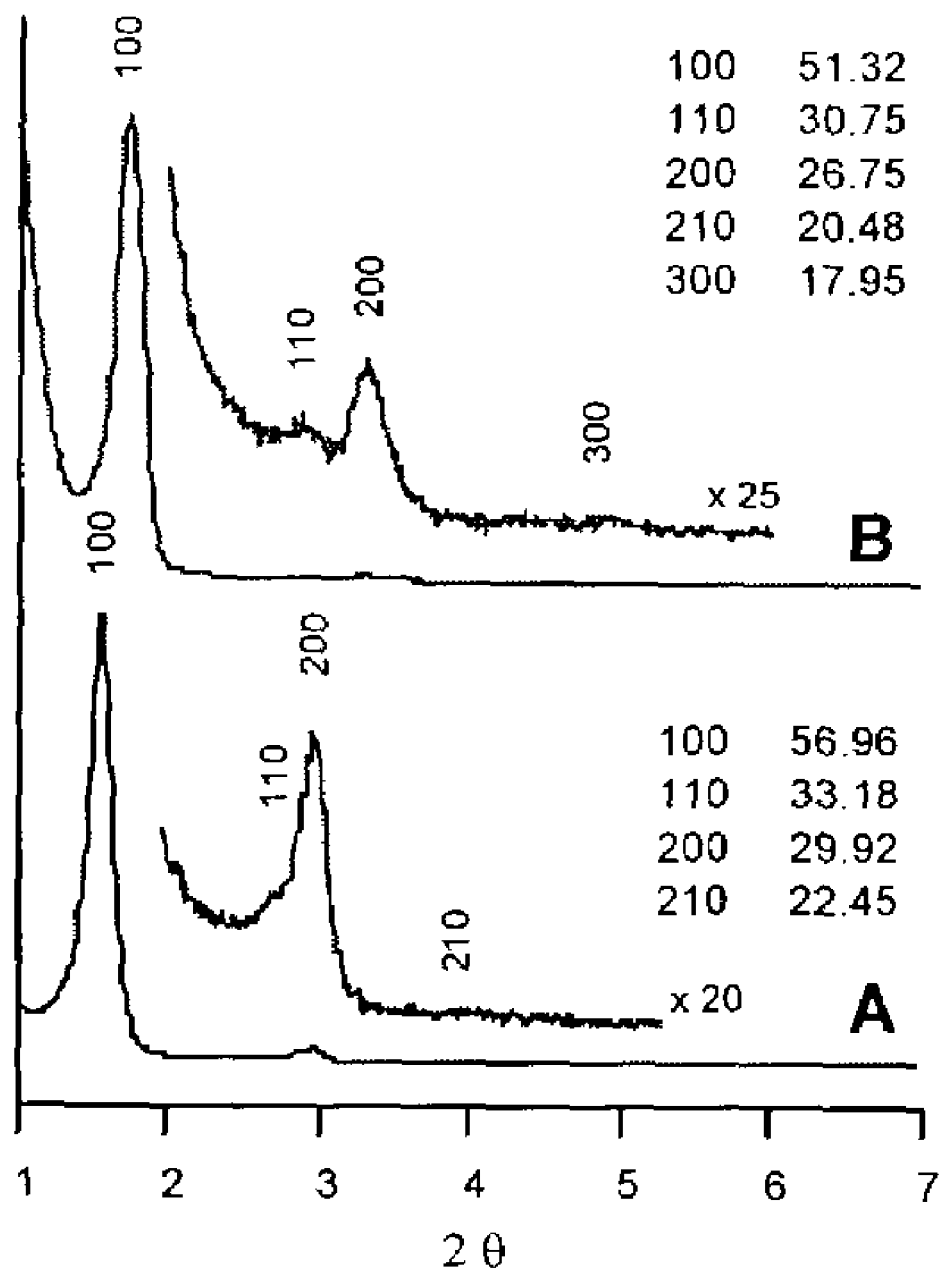
FIG. 12 is a P-XRD pattern of an uncalcined mesoporous film (A=unexposed, B=UV exposed)

Another functional pattern obtained is the definition of hydrophobic and hydrophilic regions based on UV exposure. Photolysis of the photoacid generated organics made the UV exposed regions hydrophobic (contact angle=40°) whereas the unexposed regions remained hydrophilic (contact angle<10°). FIG. 11D, which shows an array of water droplets contained within patterned hydrophobic/hydrophilic corrals, is a manifestation of this property.

In particular embodiments of the present invention, a material having regions with differential wetting behavior may be used for selective deposition of hydrophilic and/or hydrophobic precursors. Suitable precursors include organic, inorganic, biological and metallic compounds. Aqueous solutions of metals salts like cobalt nitrate or nickel nitrate or solution containing biological molecules such as lysine exhibit differential wetting behavior on the patterned films. The solution is present on the hydrophilic region and absent on the hydrophobic. This allows the precursors in the solution (e.g. cobalt nitrate or lysine) to attach (physically or chemically) to the underlying film maintaining the spatial definition of the optical patterning process.

EXAMPLE 2

Figure 13A:
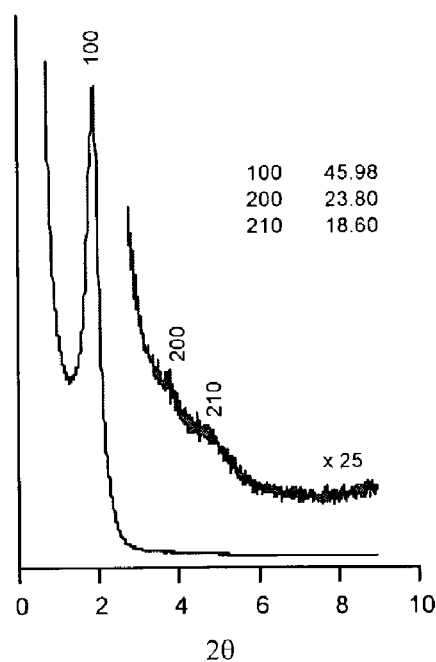
FIG. 13A is a PXRD pattern for calcined and unexposed film.
Figure 13B:
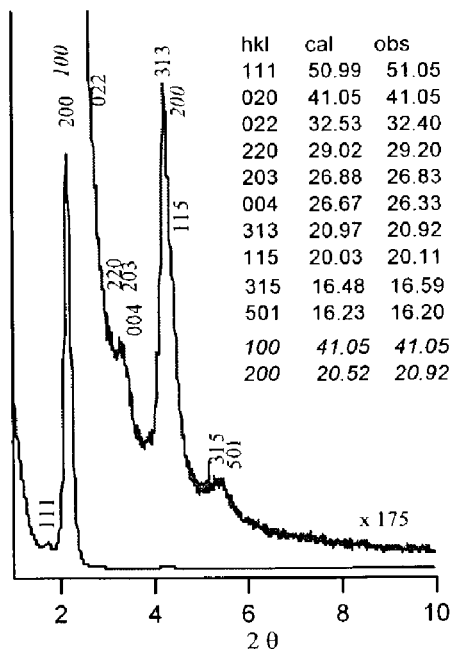
FIG. 13B is a PXRD pattern for calcined and UV exposed film showing a cubic phase.

The second mode of optical-mediation is the patterning of mesophases/mesostructure in thin films. Initial experiments were carried out to determine the pH sensitivity of the silica/surfactant mesophases. Based on these experiments the experimental parameters were chosen to perform nano-structural lithography. The P-XRD pattern, see FIG. 13, for the film fragments detached from the petri dish (to prevent one dimensional shrinkage) and calcined are distinctly different. The unirradiated film (trace A) retains the hexagonal structure (lower curvature) with unit cell constant a=52.8 Å. In case of the irradiated film (trace B), presence of a tetragonal phase (higher curvature) with unit cell constant a=b=82.1 Å, c=106.6 Å along with a hexagonal mesophase (a=47.4 Å) is observed. FIG. 13A is a PXRD pattern for calcined and unexposed film. FIG. 13B is PXRD pattern for calcined and UV exposed film showing a cubic phase.

Figure 14A:
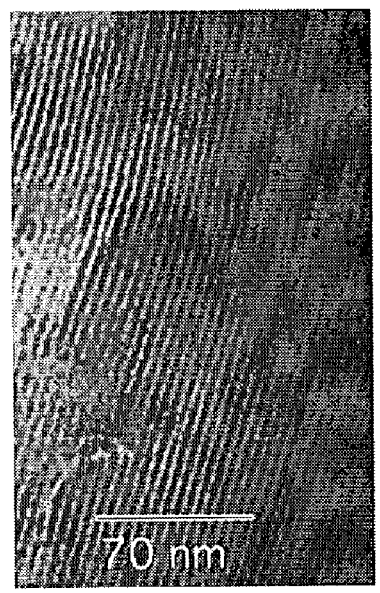
FIG. 14A is a TEM image for an unirradiated and calcined mesoporous film.
Figure 14B:
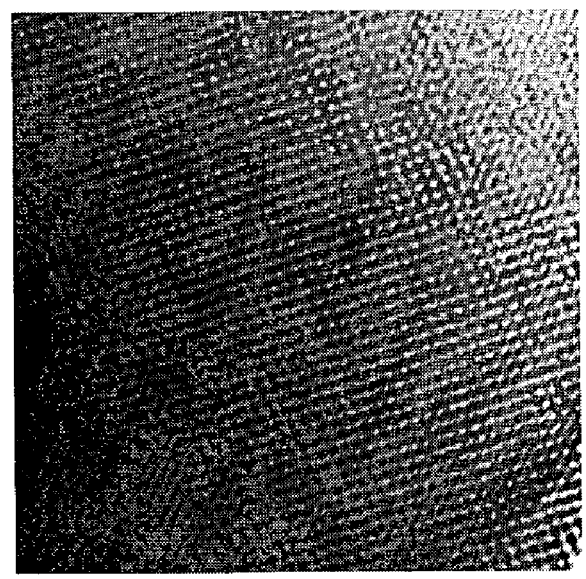
FIG. 14B is a TEM image for an irradiated and calcined mesoporous film.

The TEM image for the unirradiated and calcined film, see FIG. 14A, shows a striped pattern consistent with the [110]-zone axis of a 1-dH mesophase. FIG. 14B shows the [100]-zone axis for the tetragonal mesophase present in the irradiated and calcined film.

Figure 15A:
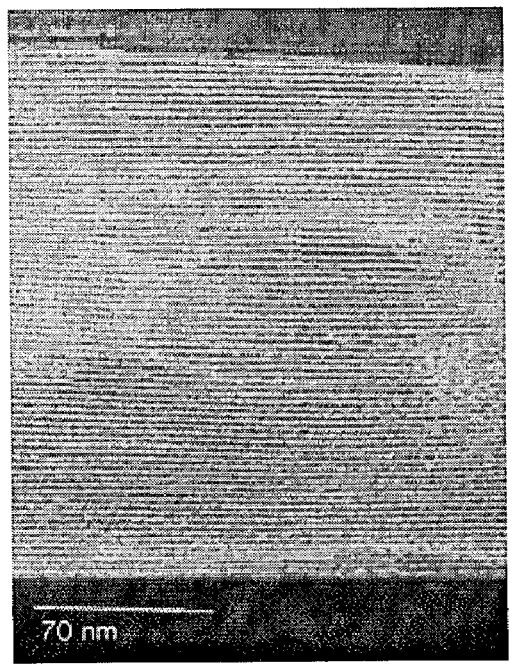
FIG. 15A is a cross-sectional TEM image for an unirradiated/calcined mesoporous film.
Figure 15B:
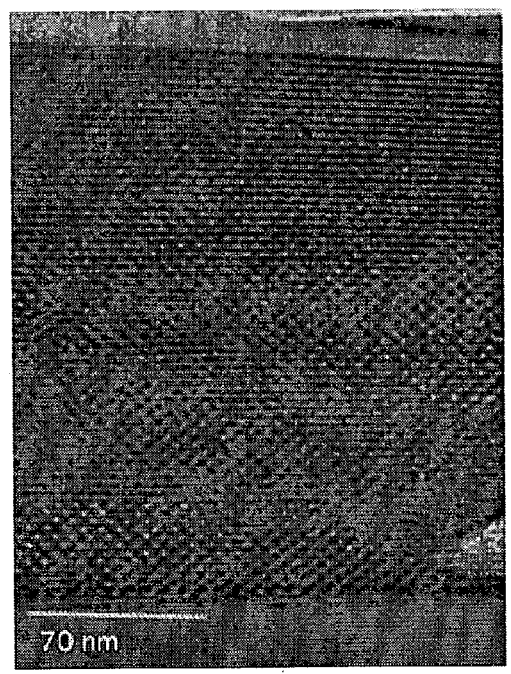
FIG. 15B is a cross-sectional TEM image for an irradiated/calcined mesoporous film.

The trend for films dip-coated on Si (100) substrates was similar. FIGS. 13A and 13B show the XRD pattern for calcined silica/surfactant thin film mesophases. The pattern for the unirradiated film (trace A) is consistent with a 1 dH mesophase with unit cell constant a=42.1 Å, whereas the pattern for the irradiated film (trace B) is indicative of the presence of a tetragonal phase (note the 111 reflection) with a=66.8 Å, b=c=72.8 Å. To establish that the phase transformation is a result of the pH change, unirradiated films were exposed to HCl vapors and then calcined. The pattern (trace C) for such a film is akin to the one obtained for the irradiated film (trace B). A cross-sectional TEM image for the unirradiated/calcined film, see FIG. 15A, shows a layered structure consistent with the [110] direction of a 1-dH mesophase with the tubules oriented parallel to the substrate. A cross-sectional TEM for the irradiated/calcined, see FIG. 15B, captures the transition from 1 dH to a tetragonal or distorted cubic mesophase.

EXAMPLE 3

Precursor solutions were prepared by addition of a surfactant and a photoacid (a diaryliodonium hexafluoroantimonate compound) to polymeric silica sols made by a two-step procedure (A2**), C. J. Brinker, R. Sehgal, R. Raman, P. Schunk, T. Headley, J. Sol-Gel Sci. & Tech., 2, 469-476, 1994, designed to minimize the siloxane condensation rate, see C. J. Brinker, R. Sehgal, R. Raman, P. Schunk, T. Headley, J. Sol-Gel Sci. & Tech., 2, 469-476, 1994, and promoting facile silica-surfactant supra-molecular self-assembly during film deposition, the entire contents and disclosures of the above documents are hereby incorporated by reference. First, TEOS ($Si(OC_2H_5)_4$), ethanol, water and HCl (mole ratios 1:4:1:5×10$^{-5}$) were heated at 60° C. for 90 min. This sol was diluted with ethanol (1 sol:2 $C_2H_5OH$) followed by addition of water and HCl. Finally, surfactant and the photoacid were added such that the final reactant mole ratios were 1 TEOS:20 $C_2H_5OH$:3.1$H_2O$:0.0065 HCl: 0.127 CTAB:0.00625 photoacid and 1 TEOS:20 $C_2H_5OH$: 3.1$H_2O$:0.0065 HCl:0.0956 Brij 56:0.0156 photoacid.

Films were deposited on (100)-silicon by dip-coating at 25.4 cm/min. The coating environment was varied from dry conditions (CTAB system) to a relative humidity of 30-40% (Brij 56 system). Following film deposition, the samples were irradiated with short-wave ultraviolet (UV) light for 2 hours through a mask via proximity printing to effectively transfer the pattern onto the silica thin film. Etching of the films was carried out with a 0.2 M NaOH solution. These films were then calcined at 450° C. for 3 hours at a ramp rate of 1° C./min to burn out the organics, drive the structural transformation and give a true mesoporous film, see also FIG. 10.

Figure 16A:
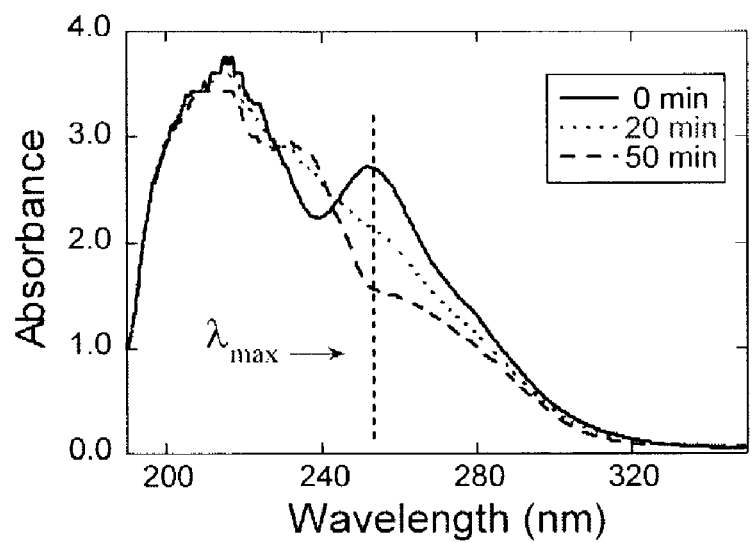
FIG. 16A is a graph illustrating decomposition of a PAG with time as followed by UV absorbance change of a typical coating sol.
Figure 16B:
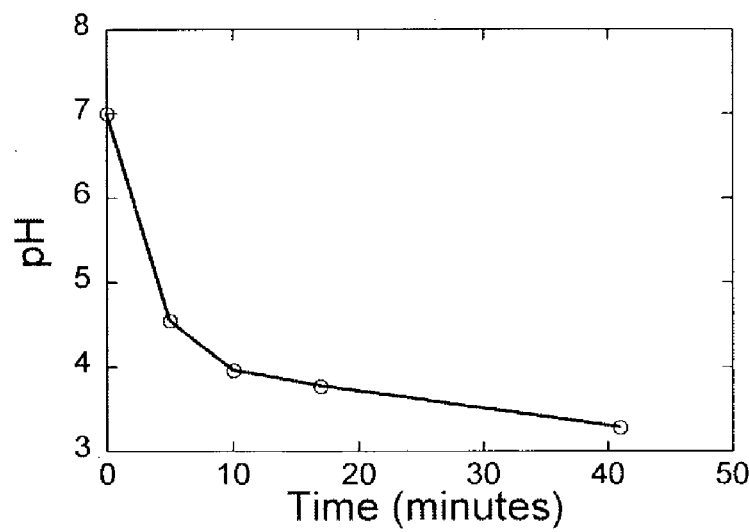
FIG. 16B is a graph illustrating a change in pH of a PAG/water solution with irradiation time.

The UV absorbance change of the coating sol with time of UV irradiation, see FIG. 16A, shows a decrease in the $\lambda_{max}$ (254 nm) intensity due to the decomposition of the photoacid, that releases a strong Brönsted acid resulting in a decrease of the pH. This behavior of pH may be seen in FIG. 16B for a photoacid/water solution. The ability to change the pH with UV irradiation in thin films was confirmed by incorporating a pH-sensitive dye (ethyl violet) in the coating sol and observing the color change from violet (pH 2.5) to yellow (pH 0) for films coated on glass slides.

Figure 17A:
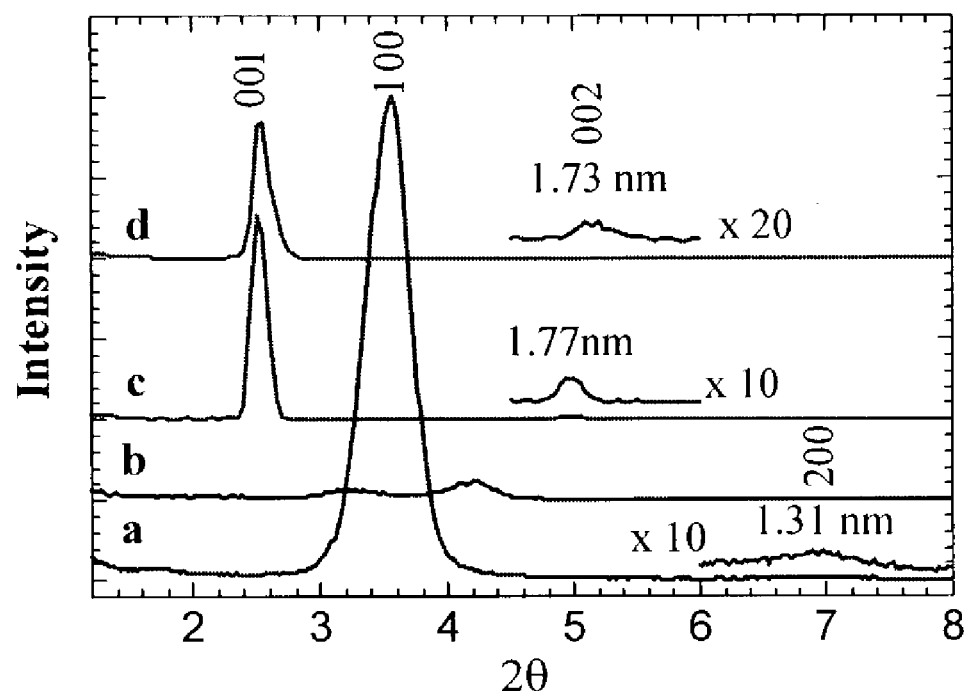
FIG. 17A is an X-ray diffraction pattern recorded on a Siemens D500 diffractometer in θ-2θ scan mode for CTAB films; with trace (c) for unirradiated, (d) for irradiated, (a) for irradiated and calcined, and (b) for unirradiated and calcined.
Figure 17B:
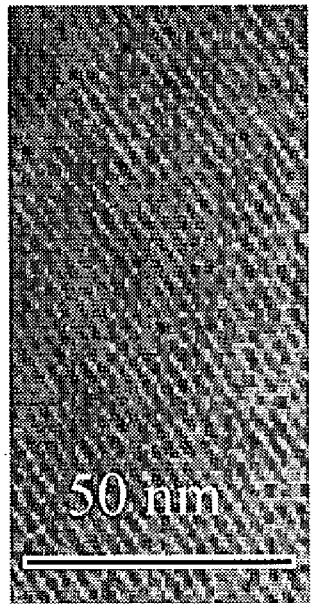
FIG. 17B is an HR-TEM image of irradiated and calcined film along the [110] 7 zone axis.
Figure 17C:
FIG. 17C is an HR-TEM image of unirradiated and calcined film along the [110] zone axis.

The influence of photolysis on the mesostructure of the silica films may be seen in FIG. 17A, which shows X-ray diffraction (XRD) patterns for CTAB films with and without UV irradiation. The as-prepared films (trace c,d) are lamellar in nature, with the photoacid causing a 1 Å swelling over the typical CTAB bi-layer spacing of 34.5 Å, see X. Auvray, C. Petipas, R. Anthore, I. Rico and A. Lattes, J. Phys. Chem., 93, 7458-7464, (1989), the entire contents and disclosure of which is hereby incorporated by reference. On irradiation there is a decrease in the basal spacing (trace d) as a result of photoacid-catalyzed network condensation. The presence of the photoacid in the unirradiated film results in destruction (destabilization) of the sensitive cubic phase expected to be formed upon calcination, Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364-368, 1997, the entire contents and disclosure of which is hereby incorporated by reference, depicted by the broad and weak reflections in the XRD pattern (trace b). For the UV irradiated film (trace a), a decrease in pH overwhelms the effect of the photoacid, resulting in a 1 dH mesophase with a unit cell constant a=30.2 Å. This observation is consistent with the results obtained by increasing the acid concentration in the coating sol, Y. Lu, R. Ganguli, C. A. Drewien, M. T. Anderson, C. J. Brinker, W. Gong, Y. Guo, H. Soyez, B. Dunn, M. H. Huang, J. I. Zink, Nature, 389, 364-368, 1997, the entire contents and disclosure of which is hereby incorporated by reference. The XRD data is supported by the high resolution-TEM images showing a layered structure as expected for 1 dH mesophase, see FIG. 17B, in the irradiated and calcined film, but a disordered structure is seen for the unirradiated and calcined film, see FIG. 17C.

Figure 18:
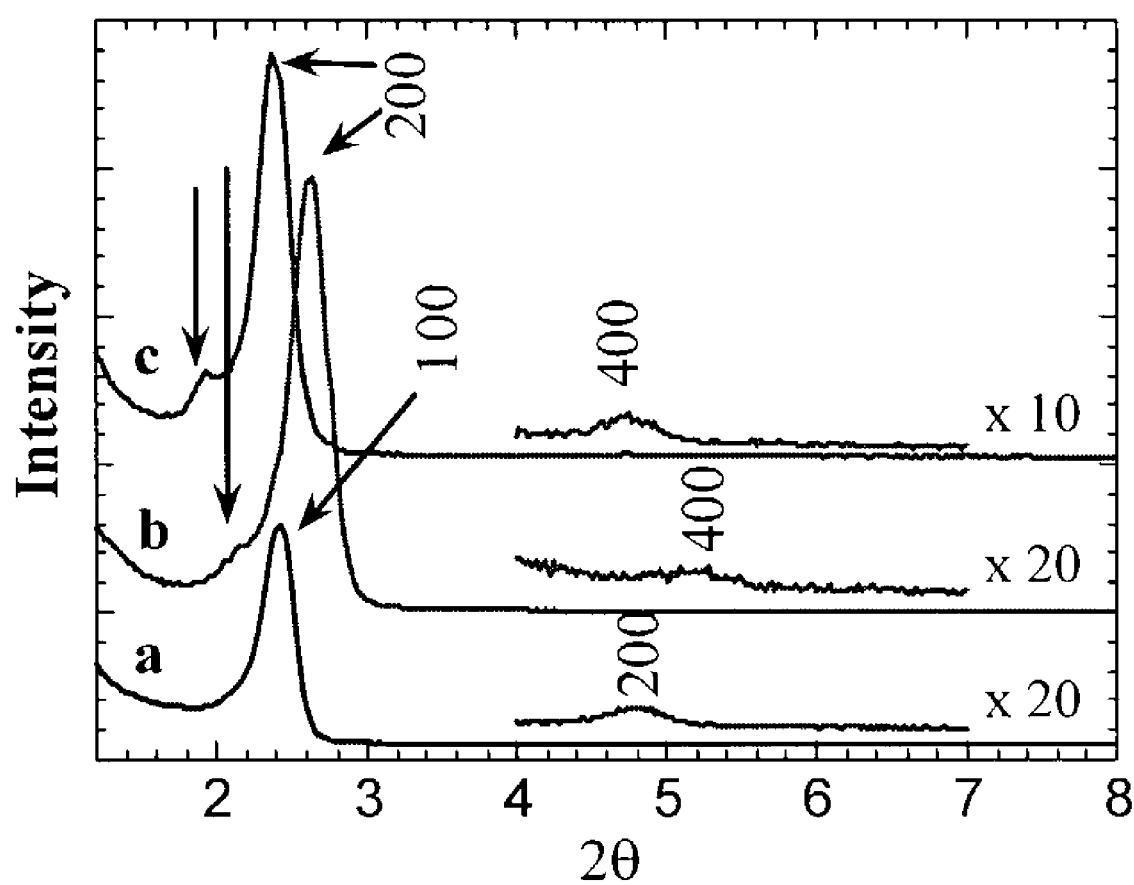
FIG. 18 is an XRD pattern for Brij 56 films; with trace (a) for unirradiated calcined; (b) for irradiated calcined, and (c) for unirradiated film exposed to HCl vapors, and then calcined.

Initial experiments have shown a strong pH dependence of the mesophase for the Brij 56 system as well, in which the cooperative self-assembly process is based on hydrogen bonding interactions. XRD patterns, see trace a of FIG. 18, for Brij 56 suggest a 1 dH structure with unit cell constant a=42.1 Å, for the unirradiated calcined film. Trace b shows the corresponding irradiated calcined sample with a pattern that is indicative of a cubic structure. To confirm that this transformation is caused by a pH change in the film, the unirradiated film was exposed to HCl vapor and then calcined (trace c). The data for this film shows a pattern consistent with the UV irradiated film, indicative of a cubic structure distorted to tetragonal by one-dimensional shrinkage. The unit cell constants would be a=66.8 Å, b=c=72.8 Å and a=74.2 Å, c=82 Å for the irradiated and HCl-exposed films, respectively.

The influence of photolysis may be seen optically in FIG. 3B due to the differences in thickness and refractive index amongst the various regions of the pattern. Initially, the thickness of the irradiated region is lower than that of the unirradiated region as a result of acid promoted siloxane condensation and the associated network shrinkage. This pre-calcination condensation makes the network resistant to further shrinkage during calcination as seen by the greater thickness of the irradiated film as compared to the unirradiated one, see Table 1 below. The refractive index difference of 0.025 at 630 nm makes it attractive for wave-guide applications. The back-scattered emission image and the EDX analysis performed using an SEM showed no chemical difference between the irradiated and unirradiated parts of the film.

TABLE 1

Ellipsometry data (λ = 630 nm) showing thickness and refractive index for B56 films

| | As-prepared Films | | Calcined Films | |
|---|---|---|---|---|
| | Thickness Å | Refractive Index | Thickness Å | Refractive Index |
| Unirradiated | 3651 ± 26 | 1.454 | 2293 ± 22 | 1.302 |
| UV Irradiated | 3602 ± 21 | 1.457 | 2399 ± 23 | 1.277 |

The $^{29}$Si-NMR of films dried in a petri dish shows 80.8% extent of reaction (Q2/Q3/Q4=9.61/57.75/32.64) for the unirradiated as compared to 82.1% (Q2/Q3/Q4=8.22/55.08/36.7) for the irradiated. It may be expected that this difference would be much greater just after irradiation in the "wet" as-prepared films. This difference is utilized to selectively etch the unirradiated film with a 0.2 M NaOH solution. Presently, the etching resolution obtained is 10 μm, see FIG. 11B, although this technique holds promise to achieve far better resolution due to the encapsulation of the photoacid in well-defined pore channels. The swirling tubules seen in the HR-TEM image, see FIG. 6D, along with the XRD pattern are suggestive of the presence of a 1 dH mesophase with unit cell constant a 53.1 Å, in the etched film after calcination.

The present invention has demonstrated a simple lithographic procedure, which allows a deliberate tailoring of mesophases in thin silica films. For the first time, spatial control over the combination of different mesophases in a mesoporous material has been achieved. This ability to tailor the phase (pore orientation) on a macro scale may have far-reaching influence on the applications of these materials in separations, catalysis, sensors and optoelectronics. Detailed investigations showed that photolysis of a photoacid results in a release of a strong acid, which causes an increase in the degree of condensation of the silica network, along with a transformation of the lyotropic phase. The use of different surfactant systems proved the versatility of this process.

In addition to the ability to tailor the mesophase, the process shows great potential to pattern a film and build hierarchical structures by exploiting the negative resist characteristics of the photoactive silica thin film. Future work, and therefore an extension of this process, involves the use of different photosensitive molecules and other material combinations to access not only different pH domains but also other mesophases.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method comprising:
   forming a mesoporous material including:
   coating a sol on a substrate to form a film, said sol comprising: at least one photoactivator generator, at least one surfactant, at least one templating molecule and at least one material capable of being sol-gel processed; and
   exposing said film to light to define the mesoporous material.

2. The method of claim 1, wherein said light is UV radiation.

3. The method of claim 1, wherein said sol further comprises a solvent.

4. The method of claim 3, wherein said solvent comprises ethyl alcohol.

5. The method of claim 1, wherein said at least one photoactivator generator comprises at least one photoacid.

6. The method of claim 1, wherein said at least one photoactivator generator comprises at least one photobase.

7. The method of claim 1, wherein said at least one photoactivator generator comprises at least one photoinitiator.

8. The method of claim 1, wherein said at least one photoactivator generator comprises at least one photocleavable compound.

9. The method of claim 1, wherein said at least one photoactivator generator comprises at least one photolabile compound.

10. The method of claim 1, wherein said at least one photoactivator generator comprises at least one photodecomposable compound.

11. The method of claim 1, wherein said at least one photoactivator generator comprises at least one photopolymerizable compound.

12. The method of claim 1, wherein said at least one photoactivator generator comprises at least one photoamphiphile.

13. The method of claim 1, wherein said photoactivator generator comprises a diaryliodonium compound.

14. The method of claim 1, wherein said at least one photoactivator generator is selected from the group consisting of photoacids, photobases, photoinitiators, photocleavable compounds, photolabile compounds, photodecomposable compounds, photopolymerizable compounds, photoamphiphiles and combinations thereof.

15. The method of claim 1, wherein said sol further comprises an acid for adjusting the pH of said sol.

16. The method of claim 1, wherein said at least one material capable of being sol-gel processed comprises silica.

17. The method of claim 1, wherein said at least one material capable of being sol-gel processed comprises at least one organo-metal alkoxide.

18. The method of claim 1, wherein said at least one material capable of being sol-gel processed comprises silicon.

19. The method of claim 1, wherein said at least one material capable of being sol-gel processed comprises aluminum.

20. The method of claim 1, wherein said at least one material capable of being sol-gel processed comprises boron.

21. The method of claim 1, wherein said at least one material capable of being sol-gel processed comprises lead.

22. The method of claim 1, wherein said at least one material capable of being sol-gel processed comprises tin.

23. The method of claim 1, wherein said at least one material capable of being sol-gel processed comprises titanium.

24. The method of claim 1, wherein said at least one material capable of being sol-gel processed comprises zinc.

25. The method of claim 1, wherein said at least one material capable of being sol-gel processed comprises zirconium.

26. The method of claim 1, wherein said at least one material capable of being sol-gel processed comprises cerium.

27. The method of claim 1, wherein said at least one material capable of being sol-gel processed comprises lanthanum.

28. The method of claim 1, wherein said at least one material capable of being sol-gel processed comprises yttrium.

29. The method of claim 1, wherein said at least one material capable of being sol-gel processed comprises neodymium.

30. The method of claim 1, wherein said templating molecule comprises a hydrogen-bonding molecule.

31. The method of claim 1, wherein said templating molecule comprises an ionic molecule.

32. The method of claim 1, wherein said templating molecule comprises a non-ionic molecule.

33. The method of claim 1, wherein said templating molecule comprises an amphiphilic molecule.

34. The method of claim 1, wherein said templating molecule comprises $CH_3(CH_2)_{15}N^+(CH_3)_3$ $Br^-$.

35. The method of claim 1, wherein said templating molecule comprises $CH_3(CH_2)_{15}(OCH_2CH_2)_{10}OH$.

36. The method of claim 1, wherein at least two regions of said mesostructured material have different physical and chemical properties.

37. The method of claim 36, wherein said at least two regions have different refractive indexes in comparison to each other.

38. The method of claim 36, wherein said at least two regions have different dielectric constants in comparison to each other.

39. The method of claim 36, wherein said at least two regions have different mesostructures in comparison to each other.

40. The method of claim 36, wherein said at least two regions have different pore volumes in comparison to each other.

41. The method of claim 36, wherein said at least two regions have different pore sizes in comparison to each other.

42. The method of claim 36, wherein said at least two regions have different thicknesses in comparison to each other.

43. The method of claim 36, wherein said at least two regions have different surface areas in comparison to each other.

44. The method of claim 36, wherein said at least two regions have different unit cell dimensions as detected by X-ray diffraction in comparison to each other.

45. The method of claim 36, wherein said at least two regions have different etching behaviors in comparison to each other.

46. The method of claim 36, wherein said at least two regions have different wetting behaviors in comparison to each other.

47. The method of claim 46, further comprising selectively depositing at least one hydrophobic precursor on said at least two regions.

48. The method of claim 47, wherein said hydrophobic precursor is an organic precursor.

49. The method of claim 47, wherein said hydrophobic precursor is an inorganic precursor.

50. The method of claim 47, wherein said hydrophobic precursor is a biological precursor.

51. The method of claim 47, wherein said hydrophobic precursor is a metallic precursor.

52. The method of claim 46, further comprising selectively depositing at least one hydrophilic precursor on said at least two regions.

53. The method of claim 52, wherein said hydrophilic precursor is an organic precursor.

54. The method of claim 52, wherein said hydrophilic precursor is an inorganic precursor.

55. The method of claim 52, wherein said hydrophilic precursor is a biological precursor.

56. The method of claim 52, wherein said hydrophilic precursor is a metallic precursor.

57. The method of claim 36, further comprising etching at least part of said at least two regions.

58. The method of claim 57, wherein said at least one etched region is etched without employing a photoresist mask.

59. The method of claim 57, further comprising calcinating said mesostructured material after said at least one region has been etched.

60. The method of claim 36, wherein said different physical properties are discreet between said at least two regions.

61. The method of claim 36, wherein said different physical properties form a gradient between said at least two regions.

62. The method of claim 61, wherein said gradient is a continuous gradient.

63. The method of claim 1, further comprising calcinating said mesostructured material.

64. The method of claim 1, wherein said at least one photoactivator generator includes at least one photopolymerizable compound and exposing said film to light polymerizes said at least one photopolymerizable compound.

65. The method of claim 64, wherein said at least one photopolymerizable compound is an epoxide monomer.

66. The method of claim 64, wherein exposing said film to light to polymerize said at least one photopolymerizable compound forms a patterned mesoporous material having at least one open pore and at least one closed pore.

* * * * *

UNITED STATES PATENT AND TRADEMARK OFFICE
CERTIFICATE OF CORRECTION

| | |
|---|---|
| PATENT NO. | : 7,332,264 B2 |
| APPLICATION NO. | : 10/373565 |
| DATED | : February 19, 2008 |
| INVENTOR(S) | : Doshi et al. |

It is certified that error appears in the above-identified patent and that said Letters Patent is hereby corrected as shown below:

In column 1, lines 21–24, delete "This invention is made with government support under Grant Number BF-4277 awarded by Sandia National Laboratories. The government may have certain rights in this invention." and insert -- This invention was developed under Contract no. DE-AC04-94AL85000 between Sandia Corporation and the U.S Department of Energy. The U.S. Government has certain rights in this invention. --, therefor.

Signed and Sealed this

Sixth Day of October, 2009

David J. Kappos
*Director of the United States Patent and Trademark Office*